(12) United States Patent
Pizzurro et al.

(10) Patent No.: US 9,812,689 B2
(45) Date of Patent: Nov. 7, 2017

(54) COMMUNITY ENERGY STORAGE SYSTEM WITH BATTERY BANK DEACTIVATION

(71) Applicant: Ecamion Inc., Markham (CA)

(72) Inventors: Carmine Pizzurro, Markham (CA); Himanshu Sudan, Toronto (CA); Peter McKinnon, Whitby (CA); Leo Canali, Whitby (CA)

(73) Assignee: ECAMION INC. (CA)

( * ) Notice: Subject to any disclaimer, the term of this patent is extended or adjusted under 35 U.S.C. 154(b) by 110 days.

(21) Appl. No.: 14/646,878

(22) PCT Filed: Nov. 22, 2013

(86) PCT No.: PCT/CA2013/000977
§ 371 (c)(1),
(2) Date: May 22, 2015

(87) PCT Pub. No.: WO2014/078941
PCT Pub. Date: May 30, 2014

(65) Prior Publication Data
US 2015/0287971 A1 Oct. 8, 2015

Related U.S. Application Data

(60) Provisional application No. 61/729,404, filed on Nov. 22, 2012.

(51) Int. Cl.
*H01M 2/10* (2006.01)
*H01M 2/20* (2006.01)
(Continued)

(52) U.S. Cl.
CPC ............ *H01M 2/206* (2013.01); *F16B 2/14* (2013.01); *H01M 2/1077* (2013.01); *H01M 2/34* (2013.01);
(Continued)

(58) Field of Classification Search
CPC ...... H01M 2/206; H01M 2/1077; H01M 2/34; H01M 2/348; H01M 10/613;
(Continued)

(56) References Cited

U.S. PATENT DOCUMENTS 6,031,354 A 2/2000 Wiley et al.
6,902,444 B1 * 6/2005 Shannon, Jr. ........ H01R 11/287
439/756

(Continued)

FOREIGN PATENT DOCUMENTS

EP 2503666 9/2012
WO 2013167189 11/2013

OTHER PUBLICATIONS

ISR to corresponding Int'l Pat. Appl. No. PCT/CA2013/000977, dated Feb. 26, 2014, 2 pages.

*Primary Examiner* — Raymond Alejandro
(74) *Attorney, Agent, or Firm* — Tarolli, Sundheim, Covell & Tummino LLP

(57) ABSTRACT

A community energy storage system comprises a cabinet, at least one battery bank mounted within the cabinet, the at least one battery bank comprising a plurality of battery modules electrically coupled to one another in series; and processing structure for monitoring at least one parameter of each of the battery modules, and in the event that the at least one parameter is outside of a threshold value, deactivating the at least one battery bank.

9 Claims, 14 Drawing Sheets

(51) Int. Cl.
*H01M 10/48* (2006.01)
*H01M 2/34* (2006.01)
*H01M 10/0525* (2010.01)
*H01M 10/613* (2014.01)
*H01M 10/615* (2014.01)
*H01M 10/627* (2014.01)
*H01M 10/63* (2014.01)
*F16B 2/14* (2006.01)
*G01R 31/36* (2006.01)

(52) U.S. Cl.
CPC ....... *H01M 2/348* (2013.01); *H01M 10/0525* (2013.01); *H01M 10/482* (2013.01); *H01M 10/486* (2013.01); *H01M 10/488* (2013.01); *H01M 10/613* (2015.04); *H01M 10/615* (2015.04); *H01M 10/627* (2015.04); *H01M 10/63* (2015.04); *G01R 31/3606* (2013.01); *H01M 2220/10* (2013.01); *Y02T 10/7011* (2013.01); *Y10T 24/44* (2015.01)

(58) Field of Classification Search
CPC .. H01M 10/615; H01M 10/627; H01M 10/63; H01M 10/482; H01M 10/486; H01M 2220/10; F16B 2/14; Y10T 24/44
See application file for complete search history.

(56) References Cited

U.S. PATENT DOCUMENTS

| | | |
|---|---|---|
| 8,183,870 B1 | 5/2012 | Davies |
| 8,212,524 B2 | 7/2012 | Ha et al. |
| 2009/0176417 A1 | 7/2009 | Rembach et al. |
| 2010/0052615 A1 | 3/2010 | Loncarevic |
| 2011/0045335 A1* | 2/2011 | Lee .............. H01M 2/1077 429/120 |
| 2012/0091731 A1 | 4/2012 | Nelson |
| 2013/0178992 A1 | 7/2013 | De Graeve |

\* cited by examiner

COMMUNITY ENERGY STORAGE SYSTEM WITH BATTERY BANK DEACTIVATION

CROSS-REFERENCE TO RELATED APPLICATIONS

This application is a U.S. National Stage under 35 USC 371 patent application, claiming priority to Application No. PCT/CA2013/000977, filed on Nov. 22, 2013 and entitled "Community Energy Storage System with Battery Bank Deactivation"; which claims the benefit of U.S. Provisional Application No. 61/729,404 to Pizzurro et al., filed on Nov. 22, 2012 and entitled "Community Energy Storage System", the entire content of both which are incorporated herein by reference.

FIELD OF THE INVENTION

The present invention relates generally to energy storage and in particular to a community energy storage system.

BACKGROUND OF THE INVENTION

Electric power grids need to provide electric power in a reliable fashion. These grids may comprise energy storage systems that are used to improve power quality, energy flow and reliability. The energy storage systems may also be used to reduce peak demand and offer temporary relief in neighborhoods at risk to help prioritize and defer capital work to facilitate the integration of renewable technologies such as solar panels into existing power grids.

PCT Application Publication No. WO 2013/0167189 to Tenger et al. discloses a battery energy storage system arranged to be connected to a direct current capacitor, which is connected in parallel to a power converter. The battery energy storage comprises a battery module and a controllable voltage source adapted to inject a voltage opposite to a voltage ripple of the direct current capacitor.

U.S. Patent Application Publication No. 2013/0178992 to Graeve discloses an intelligent electronic control and communications interface module for a thermal energy storage module comprising means for bi-directionally communicating data between a thermal energy storage module and a smart grid, wherein the data comprises data concerning the current status of the storage capacity, and requests to store thermal energy or to discharge thermal energy. A thermal energy storage module is also disclosed and comprises such intelligent electronic control and communications interface module.

Although energy storage systems have been considered, improvements are desired. It is therefore an object at least to provide a novel community energy storage system.

SUMMARY OF THE INVENTION

Accordingly, in one aspect there is provided a community energy storage system comprising a cabinet, at least one battery bank mounted within the cabinet, the at least one battery bank comprising a plurality of battery modules electrically coupled to one another in series, and processing structure for monitoring at least one parameter of each of the battery modules, and in the event that the at least one parameter is outside of a threshold value, deactivating the at least one battery bank.

In an embodiment, the at least one parameter is at least one of temperature, voltage, current, state of charge, cell capacity and efficiency. The processing structure indicates to a user which one of the battery modules has a parameter value outside of the threshold value.

According to another aspect there is provided a community energy storage system comprising a cabinet, at least one terminal rail mounted within the cabinet, the terminal rail comprising a plurality of terminal connectors, at least one battery bank comprising a plurality of battery modules positionable within the cabinet, each of the plurality of battery modules comprising a positive terminal and a negative terminal configured to electrically couple to a respective one of the plurality of terminal connectors, and a plurality of connectors configured to electrically couple the plurality of terminal connectors to one another such that the plurality of battery modules are electrically coupled in series.

In an embodiment, the positive and negative terminals are mechanically engaged with a respective terminal connector via friction fit. Each battery module is readily removable by disengaging the positive and negative terminals from the respective terminal connectors. In an embodiment the community energy storage system comprises switching gear configured to selectively activate and deactivate the at least one battery bank.

According to another aspect there is provided a method of monitoring a community energy storage system having at least one battery bank comprising a plurality of battery modules, the method comprising receiving a value of at least one parameter of each of the battery modules, comparing the value of the at least one parameter to a threshold value, and in the event that the value of the at least one parameter is outside the threshold value, deactivating the at least one battery bank.

In an embodiment, the at least one parameter is at least one of temperature, voltage, current, state of charge, cell capacity and efficiency. In an embodiment where the at least one parameter is temperature, the method further comprises comparing the temperature to a non-critical temperature range; and in the event that the temperature outside the non-critical temperature range, activating one of a heating system and a cooling system. In the event the value of the at least one parameter is outside the threshold value, the method further comprises indicating to a user which one of the battery modules has a value outside the threshold value. The step of indicating comprises displaying a location of the battery module that has a value outside the threshold value on a display screen.

According to another aspect there is provided a computer-readable medium having stored thereon a computer program executable by a computer to perform a method of monitoring a community energy storage system having at least one battery bank comprising a plurality of battery modules, the method comprising receiving a value of at least one parameter of each of the battery modules, comparing the value of the at least one parameter to a threshold value, and in the event that the value of the at least one parameter is outside the threshold value, deactivating the at least one battery bank.

According to another aspect there is provided a battery module comprising a housing, a plurality of groups of lithium-ion cells positioned in the housing, each group of lithium-ion cells comprising a plurality of lithium-ion cells electrically coupled to one another in parallel, wherein the plurality of groups of lithium-ion cells are connected in series, and a positive and a negative terminal connector extending from the housing, the positive terminal electrically coupled to a positive series terminal of the plurality of groups of lithium-ion cells and the negative terminal electrically coupled to a negative series terminal of the plurality of groups of lithium-ion cells.

According to another aspect there is provided a wedge clamp comprising, a housing having a channel defined therein, the channel comprising a generally flat surface and a tapered surface opposite the flat surface, at least one stopping peg extending into the channel, and a rolling clamp pin positioned within the housing, the rolling clamp pin moveable within the channel and prevented from rolling out of the channel by the at least one stopping peg.

BRIEF DESCRIPTION OF THE DRAWINGS

Embodiments will now be described more fully with reference to the accompanying drawings in which.

DETAILED DESCRIPTION OF THE EMBODIMENTS

Figure 1:
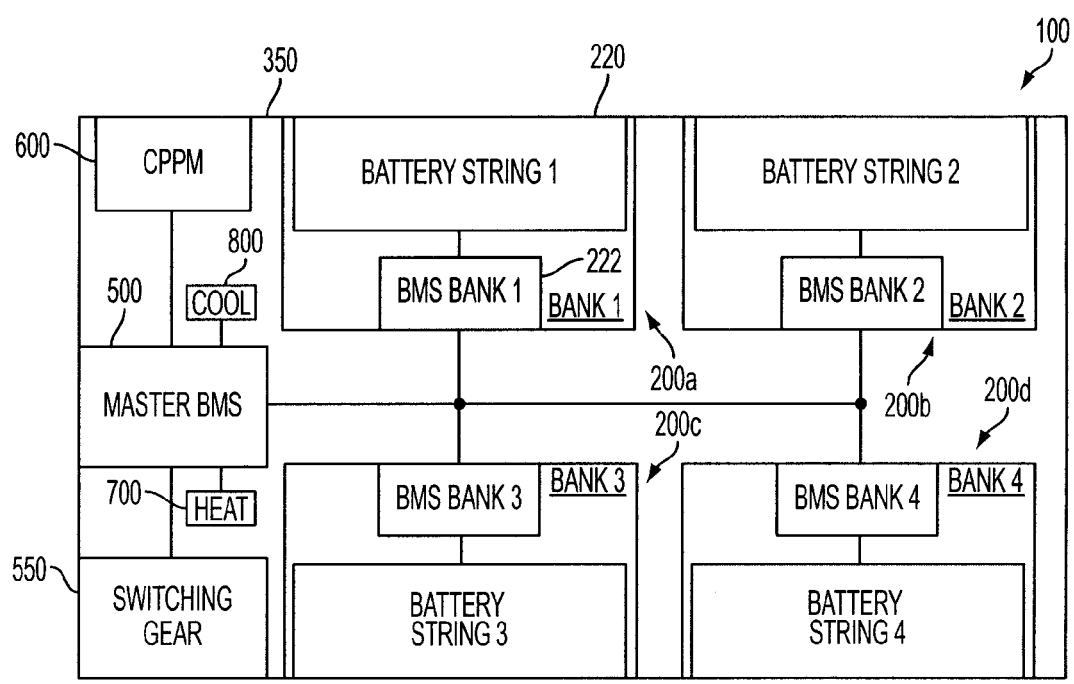
FIG. 1 is a schematic view of a community energy storage (CES) system.

Turning now to FIG. 1, a community energy storage (CES) system is shown and is generally identified by reference numeral 100. In this embodiment, the CES system 100 comprises four (4) battery banks 200a to 200d, each of which is connected to a master battery management system (BMS) 500. The BMS 500 is also connected to switching gear 550, a control protection and power management (CPPM) unit 600, a heating system 700 and a cooling system 800. All of the components of the CES system 100 are mounted within a cabinet 350.

Each battery bank 200a to 200d comprises a battery string 220 electrically coupled to a local BMS 222. In this embodiment, the battery string 220 comprises twelve (12) battery modules 230 (see FIG. 2) connected in series, as will be described below.

Figure 2:
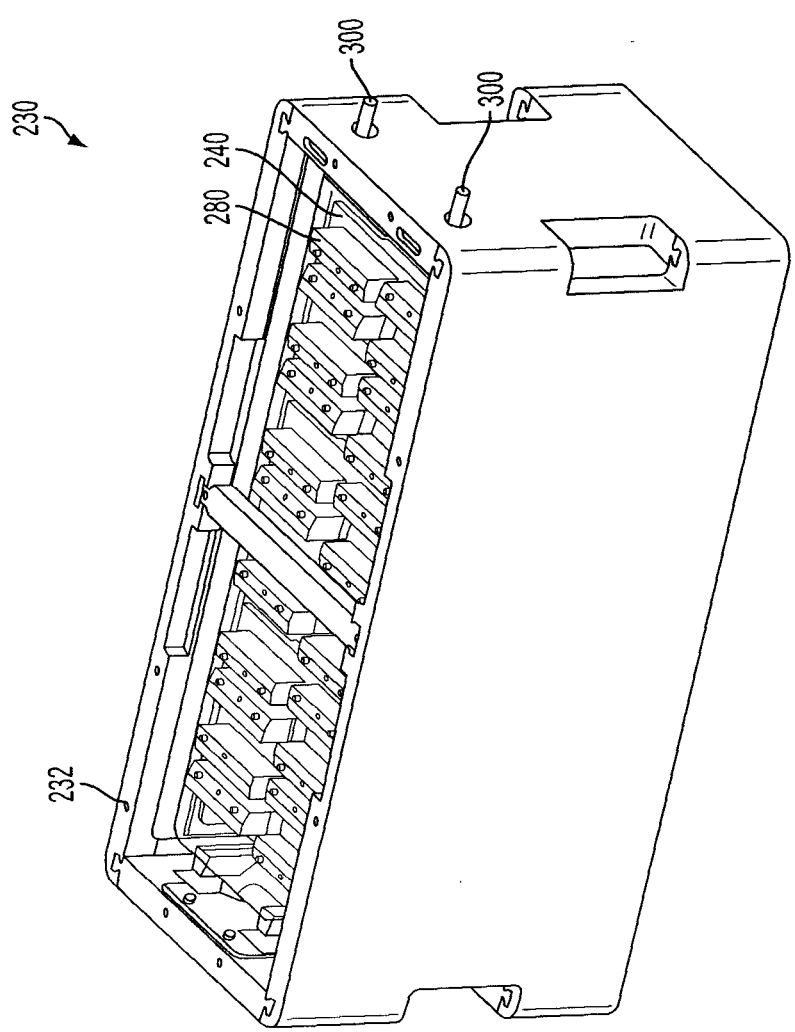
FIG. 2 is an isometric view of a battery module forming part of the CES system of FIG. 1.

Turning now to FIG. 2, an isometric view of one of the battery modules 230 is shown. The battery module 230 comprises a casing 232, a plurality of lithium-ion cells (not shown) electrically coupled to one another via three (3) boards 240 and a plurality of wedge clamps 280, a pair of male-pin connectors 300, and a local BMS (not shown) attached to boards 240 via a wiring harness.

The casing 232 is generally rectangular in shape and comprises a removable lid (not shown). In this embodiment, the casing 232 is made of high density polyethylene and houses an inner case (not shown) comprising a number of grooves configured to receive a respective lithium-ion cell and an aluminum cooling plate.

In this embodiment, the battery module 230 comprises thirty six (36) lithium-ion cells. Each lithium-ion cell comprises a positive terminal and a negative terminal.

Figure 3:
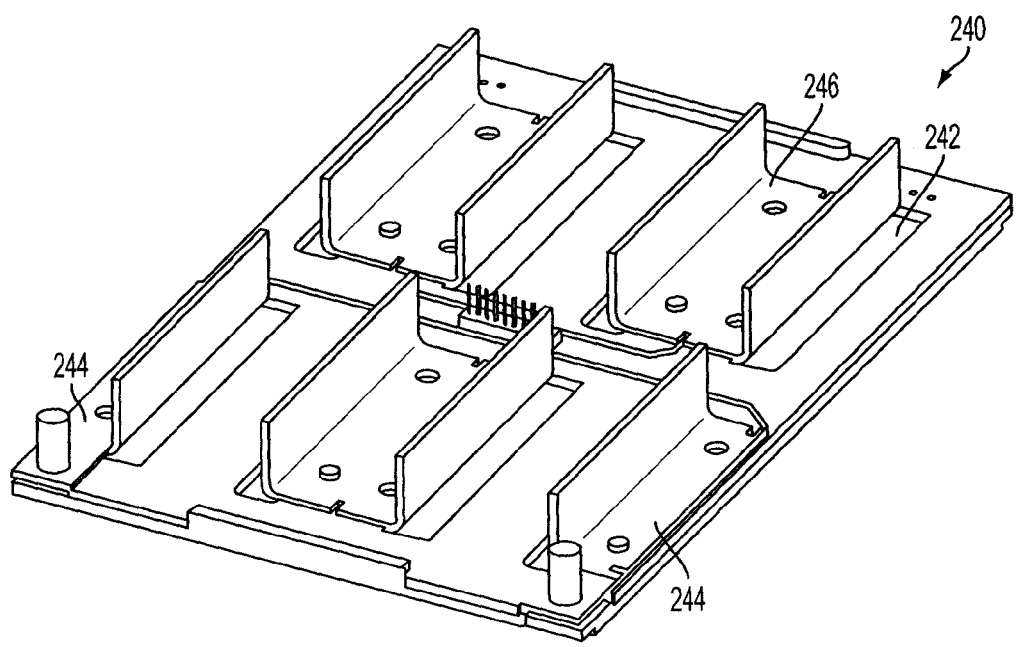
FIG. 3 is an isometric view of a board forming part of the battery module of FIG. 2.

The inner case (not shown) is configured to group the thirty six (36) lithium-ion cells into groups of three (3). The boards 240 are used to electrically couple the three (3) cells of each group to one another in parallel and to electrically couple the twelve groups of cells in series. One of the boards 240 is shown in FIG. 3. The board 240 comprises openings 242. Each opening 242 receives the negative or positive terminals of one of the groups of three (3) lithium-ion cells. As can be seen, board 240 comprises eight (8) openings 242. To connect all twelve (12) groups of three (3) lithium-ion cells, three (3) boards 240 are required.

As will be appreciated, connecting twelve (12) groups of lithium-ion cells in series requires that one negative terminal (hereinafter referred to as the "series negative terminal") of one of the groups of cells and one positive terminal (hereinafter referred to as the "series positive terminal") of another one of the groups of cells are left unconnected to any other terminal. L-shaped conductors 244 formed of an electrically conductive material such as copper are positioned adjacent to openings 242 and are used to receive the series negative terminal and the series positive terminal. The L-shaped conductor 244 positioned adjacent to the opening 242 used to receive the series negative terminal is electrically coupled to the negative male-pin connector 300. The L-shaped conductor 244 positioned adjacent to the opening 242 used to receive the series positive terminal is electrically coupled to the positive male-pin connector 300. Each one of the L-shaped conductors 244 is connected to one of the boards 240 such that one of the sides of the L-shaped conductor 244 is perpendicular to the surface of the board 240, as shown in FIG. 3.

U-Shaped conductors 246 formed of electrically conductive material such as copper are positioned adjacent to each one of the remaining openings 242. Each of the U-Shaped conductors 246 is connected to one of the boards 240 such that the bright of the U-shaped connector 246 is mounted on the board 240 and the two sides extend perpendicular to the surface of the board 240, as shown in FIG. 3.

To assemble battery module 230, the thirty six (36) lithium-ion cells are positioned within the grooves of the inner case. The groups of lithium-ion cells are positioned such that the negative terminals of one group of lithium-ion cells is adjacent to the positive terminals of a neighboring group of lithium-ion cells, and vice versa. The three (3) boards 240 are positioned within the casing 232 on top of the lithium-ion cells such that the positive and negative terminals of each group of lithium-ion cells extend through respective openings 242. As such, each one of the positive and negative terminals of each group of lithium-ion cells extends generally parallel and adjacent to one of the sides of the L-shaped conductors 244 or one of the sides of the U-shaped conductors 246. Each group of lithium-ion cells is secured to the respective side of the L-shaped conductor 244 or U-shaped conductor 246 using the wedge clamp 280.

Figure 4:
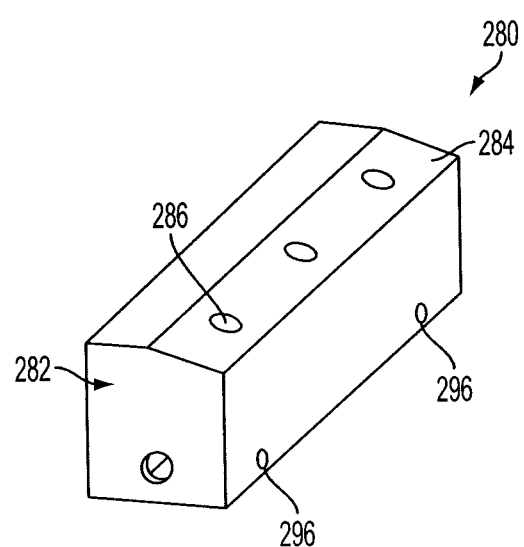
FIG. 4 is an isometric view of a wedge clamp.
Figure 5:
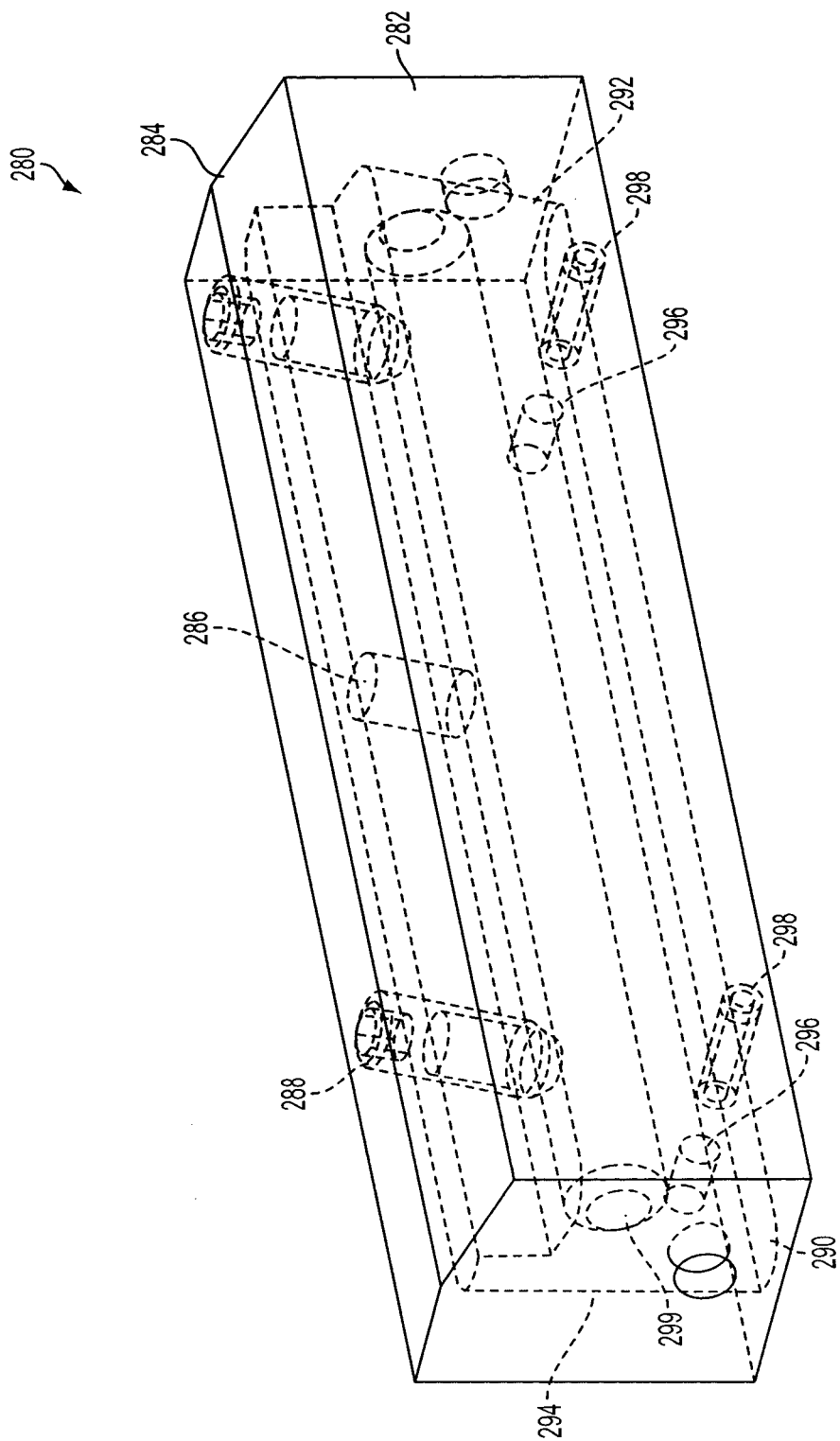
FIG. 5 is a partial exploded view of the wedge clamp of FIG. 4.

One of the wedge clamps 280 is shown in FIGS. 4 and 5. The wedge clamp comprises a housing 282 having a channel 290 defined therein. As can be seen, the housing 282 is generally rectangular shaped. A top surface of the housing 282 and has a beveled edge 284. The beveled edge 284 has three spaced-apart threaded openings 286 defined therein that extend into the channel 290. Each of the openings 286 receives a set screw 288. When desired, the set screw 288 is tightened such that at least a portion of the set screw 288 extends into the channel 290.

The channel 290 is defined within the housing 282 and comprises a tapered surface 292 and a generally flat surface 294. Openings 296 are defined in the housing 282 and extend from a back surface of the housing 282 into the tapered surface 292 of the channel 290. Stopping pegs 298 are secured within the openings 296. A portion of each of the stopping pegs 298 extends into the channel 290.

A rolling clamp pin 299 is positioned within the channel 290 and is generally cylindrical-shaped. The rolling clamp pin 299 is moveable within the channel 290 and is prevented from rolling out of the channel by the portions of the stopping pegs 298 that extend into the channel 290.

In this embodiment, to couple the group of lithium-ion cells in parallel, the negative terminals of each of the three (3) lithium-ion cells and a respective side of one of the L-shaped conductor 244 or U-shaped conductor 246 are positioned within the channel 290 of the wedge clamp 280, at a position between the rolling clamp pin 299 and the flat surface 294 of the channel 290. The set screws 288 are tightened such that a portion of each set screw 288 extends into the channel 290 and contacts the rolling clamp pin 299. Once the set screws 288 are in contact with the rolling clamp pin 299, they are further tightened forcing the rolling clamp pin 299 to move along the tapered surface 292, further securing the negative terminals of the three lithium-ion cells and the side of one of the L-shaped conductor 244 or U-shaped conductor 245 within the channel 290. As such, the negative terminals of the three lithium-ion cells and a respective side of one of the L-shaped conductor 244 or U-shaped conductor 246 are secured within the channel 290 and are electrically coupled to one another in parallel. The positive terminals of each of the three (3) lithium-ion cells and a respective side of one of the L-shaped conductor 244 or U-shaped conductor 246 are similarly coupled to one another in a separate wedge clamp 280.

As will be appreciated, the U-shaped conductors 246 couple the groups of lithium-ion cells in series. The positive terminals of a group of lithium-ion cells are connected to one side of one of the U-shaped conductors 246 and the negative terminals of a neighboring group of lithium-ion cells are connected to the other side of the U-shaped conductor 246. The three (3) boards 240 are coupled in series through the use of jumper plates (not shown).

In this embodiment, the male-pin connectors 300 are male-pin RADSOK® connectors such as that manufactured by Amphenol Corporation. As mentioned previously, one of the L-shaped conductors 244 is electrically coupled to the negative male-pin connector 300 and the other one of the L-shaped conductors 244 is electrically coupled to the positive male-pin connector 300.

Each battery module 230 comprises a local BMS (not shown). Each local BMS in this embodiment obtains measurements of parameters of the associated battery module 230 such as for example temperature, voltage, current, state of charge, cell capacity and efficiency using known methods such as through the use of sensor systems.

As mentioned previously, the battery banks 200a to 200d each comprise a battery string 220 electrically coupled to a BMS 222. The BMS 222 is communicatively coupled to the local BMS of each battery module 230 and obtains measurements of parameters of each of the battery module 230 such as for example temperature, voltage, current, state of charge, cell capacity and efficiency therefrom.

The cabinet 350 in this embodiment is a pad mount cabinet having five compartments: four battery compartments for housing a respective battery bank 200a to 200d and a control compartment for housing the master BMS 500, the switching gear 550 and the CPPM 600. Doors are provided on the cabinet 350 for providing separate access to each compartment. As will be appreciated, the configuration of the cabinet 350 permits selective access to one or more of the battery compartments while preventing access to the high-voltage side of each battery module. As will be described, this allows each battery module 230 to be replaced in a safe manner.

Figure 6:
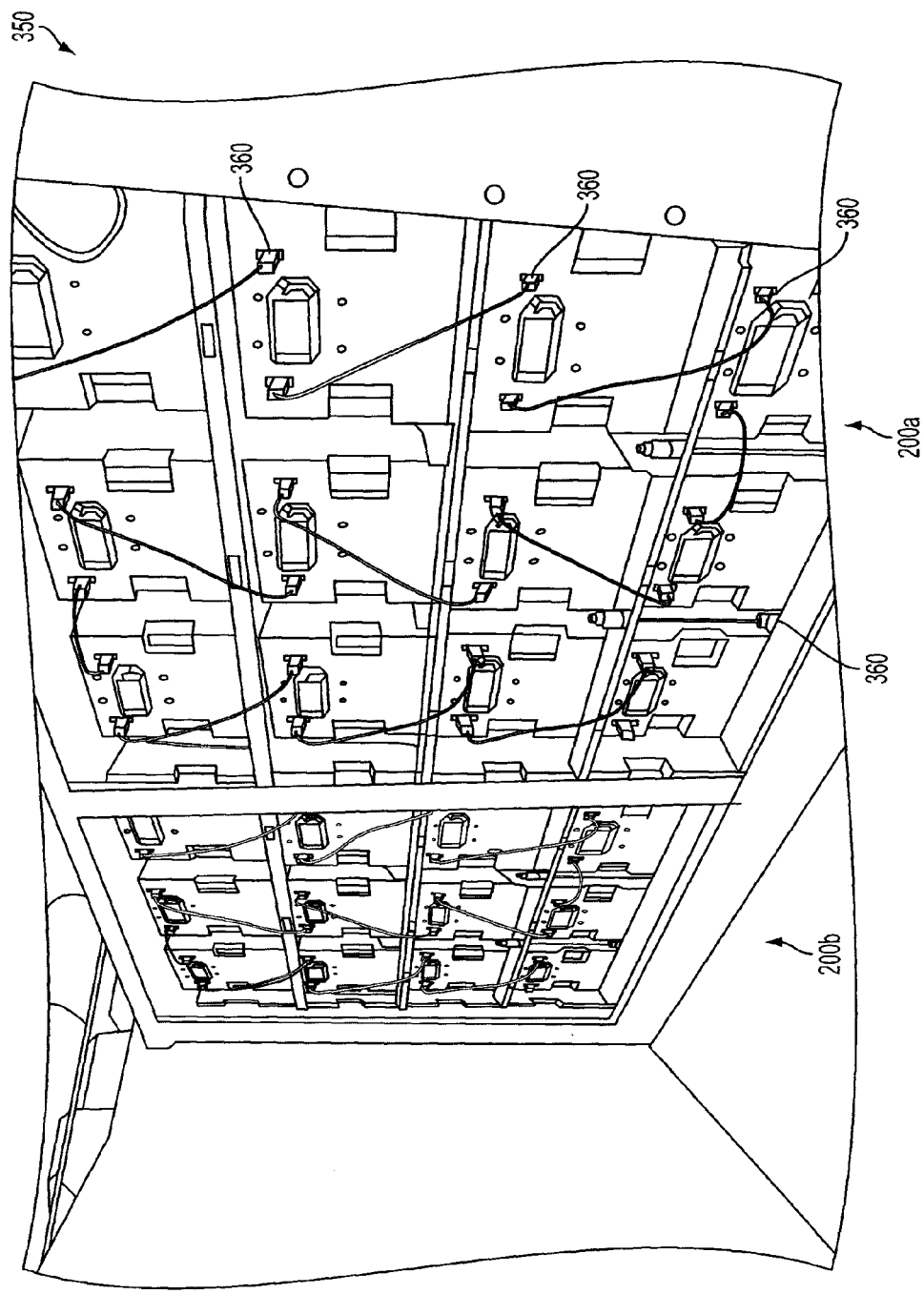
FIG. 6 shows a portion of a cabinet forming part of the CES system of FIG. 1.

FIG. 6 is a side view of the cabinet 350 having two of the doors open thereby providing access to two battery banks 200a and 200b.

Each battery compartment comprises four shelves 360. Each shelf 360 supports three batteries 230. Four non-conductive terminal rails 362 are positioned within the housing at the back end of each shelf 360, that is, opposite the end of the shelf 360 that is adjacent to the door.

Figure 7:
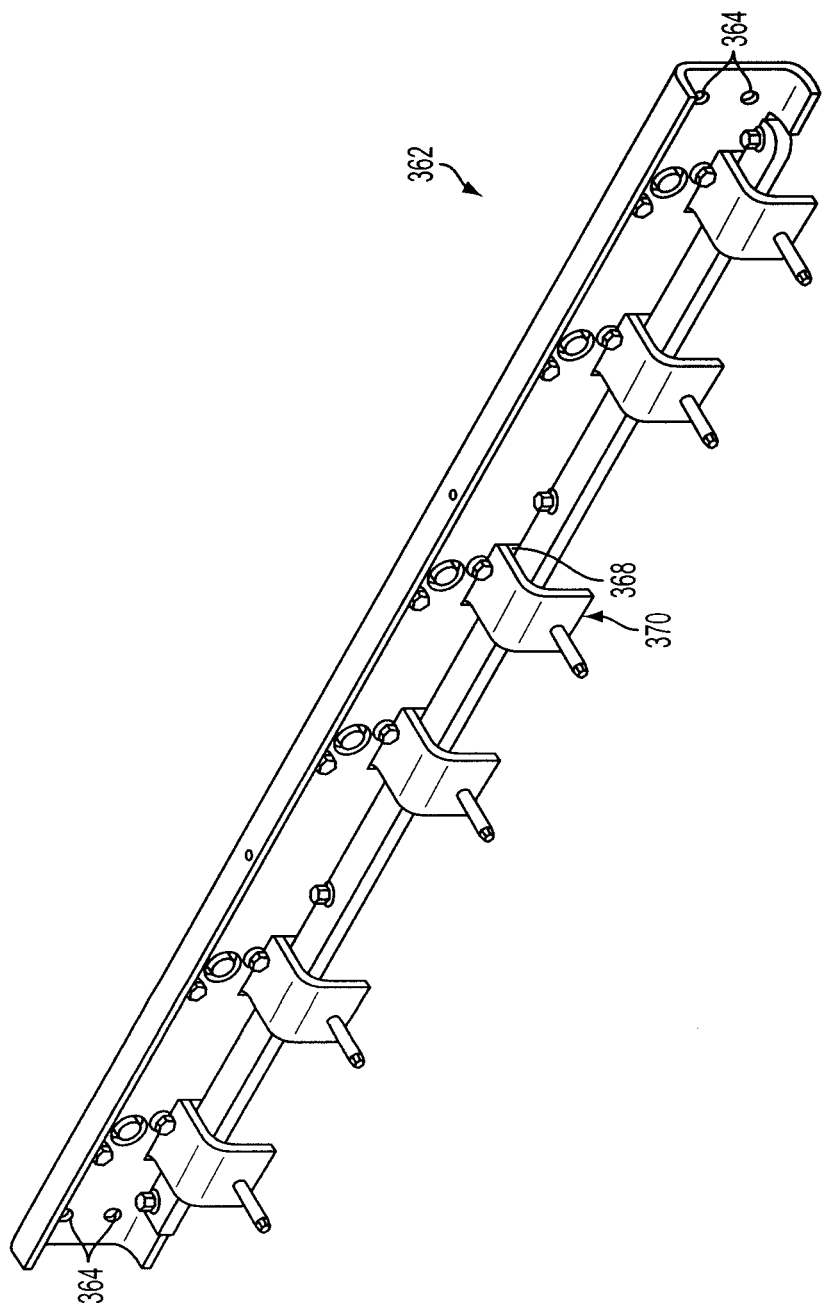
FIG. 7 is an isometric view of a non-conductive terminal rail forming part of the cabinet of FIG. 6.
Figure 8:
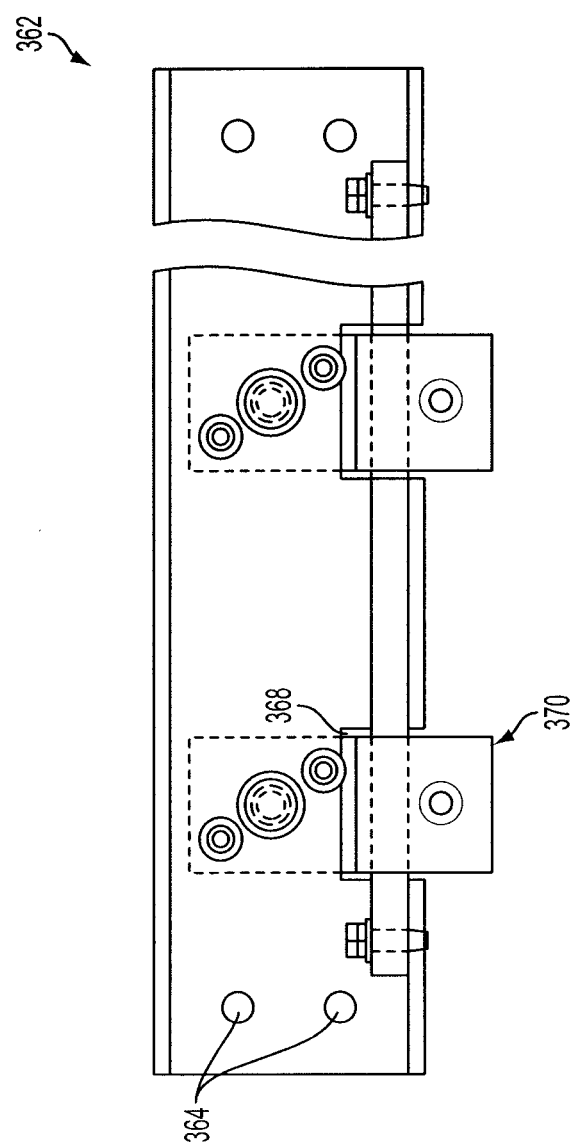
FIG. 8 is a rear view of the non-conductive terminal rail of FIG. 7.
Figure 9:
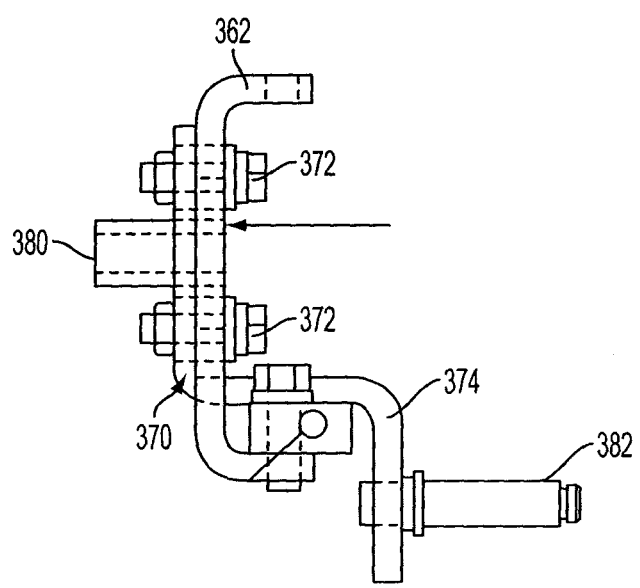
FIG. 9 is a side view of the non-conductive terminal rail of FIG. 7.

FIGS. 7 to 9 show respective isometric, rear and side views of one of the terminal rails 362. As can be seen, the terminal rail 362 has a generally C-shaped cross section and comprises mounting holes 364 for mounting within the cabinet 350 via a fastening device such as a screw. Six (6) openings 368 are defined in the terminal rail 362 and are used to receive a Z-bracket 370. The Z-bracket 370 is secured to the terminal rail 362 by a pair of fastening devices 372 such as screws.

The Z-bracket 370 comprises a Z-shaped body 374 made of an electrically conductive material such as copper. A female connector 380 is positioned on the Z-shaped body 374 adjacent one of the ends. The female connector 380 in this embodiment is a female RADSOK® connector. The female connector 380 is complimentary to and configured to receive the male-pin connector 300 of one of the battery modules 230. A male-pin connector 382 is positioned on the Z-shaped body 374 at an opposite end than that of the female connector 380. In this embodiment, the male-pin connector 382 is a male-pin RADSOK® connector. As the Z-shaped body 374 is made of an electrically conductive material, the female connector 380 and male-pin connector 382 are electrically coupled to one another.

To install one of the battery modules 230 into a respective battery bank 230, the battery module 230 is placed on one of the shelves 360. The battery module 230 is pushed back on the shelf 260 and is positioned such that the male-pin connectors 300 are aligned with a respective female connector 380 on one of the terminal rails 362. One positioned, the battery module 230 is further pushed such that each male-pin connector 300 is received by a respective female connector 380. As such, the battery module 230 is electrically coupled to the Z-shaped brackets 370. As described above, since the Z-shaped body 374 is made of an electrically conductive material, the battery module 230 is electrically coupled to the male-pin connectors 382 of the Z-brackets 370.

Figure 10:
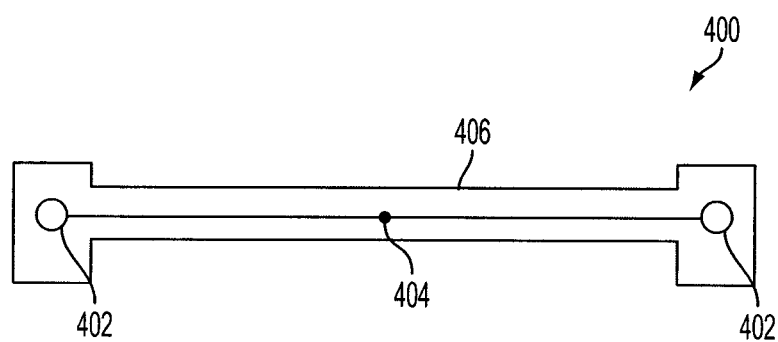
FIG. 10 is a perspective view of a RADSOK® cord.

The battery modules 230 are connected to one another in series using the male-pin connectors 382 of the Z-brackets 370. To connect the twelve battery modules 230 is series, a total of eleven (11) RADSOK® cords are used. One of the RADSOK® cords is shown in FIG. 10 and is generally identified by reference numeral 400. The RADSOK® cord 400 comprises two female RADSOK® connectors 402 each of which is positioned adjacent a respective end thereof. The female RADSOK® connectors 402 are electrically coupled to one another via an electrically conductive wire 404. The electrically conductive wire and the two female RADSOK® connectors 402 are insulated via a non-conductive material 406 such as rubber.

Figure 11:
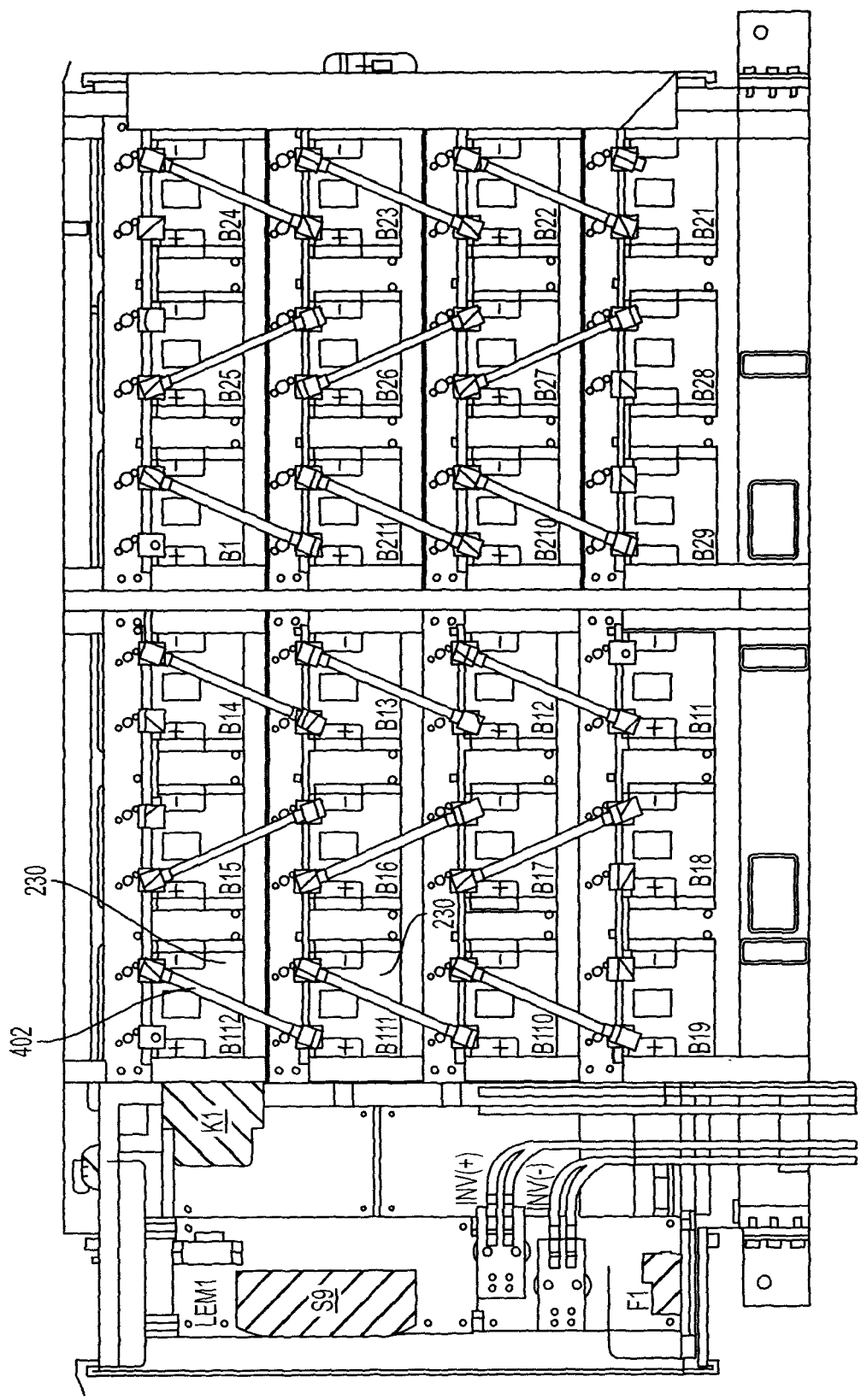
FIG. 11 is a rear view of two battery banks forming part of the CES system of FIG. 1.

The RADSOK® cords 400 connect the twelve (12) battery modules 230 in series as shown in FIG. 11. As can be seen, one of the female RADSOK® connectors 402 is connected and electrically coupled to a male-pin connector 382. As mentioned above, the male-pine connector 382 is electrically coupled to a male-pin connector 300 of one of the battery modules 230. The other female RADSOK® connector 402 is electrically coupled to another male-pin connector 382. The other male-pin connector 382 is electrically coupled to a male-pin connector 300 of another one of the battery modules 230. It will be appreciated that the female RADSOK® connectors 402 are connected to opposite terminals of the batteries 230, that is, one of the female RADSOK® connectors 402 is electrically coupled to a positive terminal of a battery module 230 and the other of the female RADSOK® connectors 402 is electrically coupled to a negative terminal of another battery module 230.

The control compartment comprises a mounting rack (not shown) for housing the master BMS 500, the switching gear 550, the CPPM 600, the heating system 700 and the cooling system 800. In this embodiment, the master BMS 500 comprises a programmable logic controller (PLC) coupled to a display screen. The master BMS 500 is electrically coupled to each of the battery banks 200a to 200d. The master BMS 500 communicatively polls the BMS 222 of each of the battery banks 200a to 200d to obtain measurements of parameters such as for example temperature, voltage, current, state of charge, cell capacity and efficiency therefrom.

Figure 12:
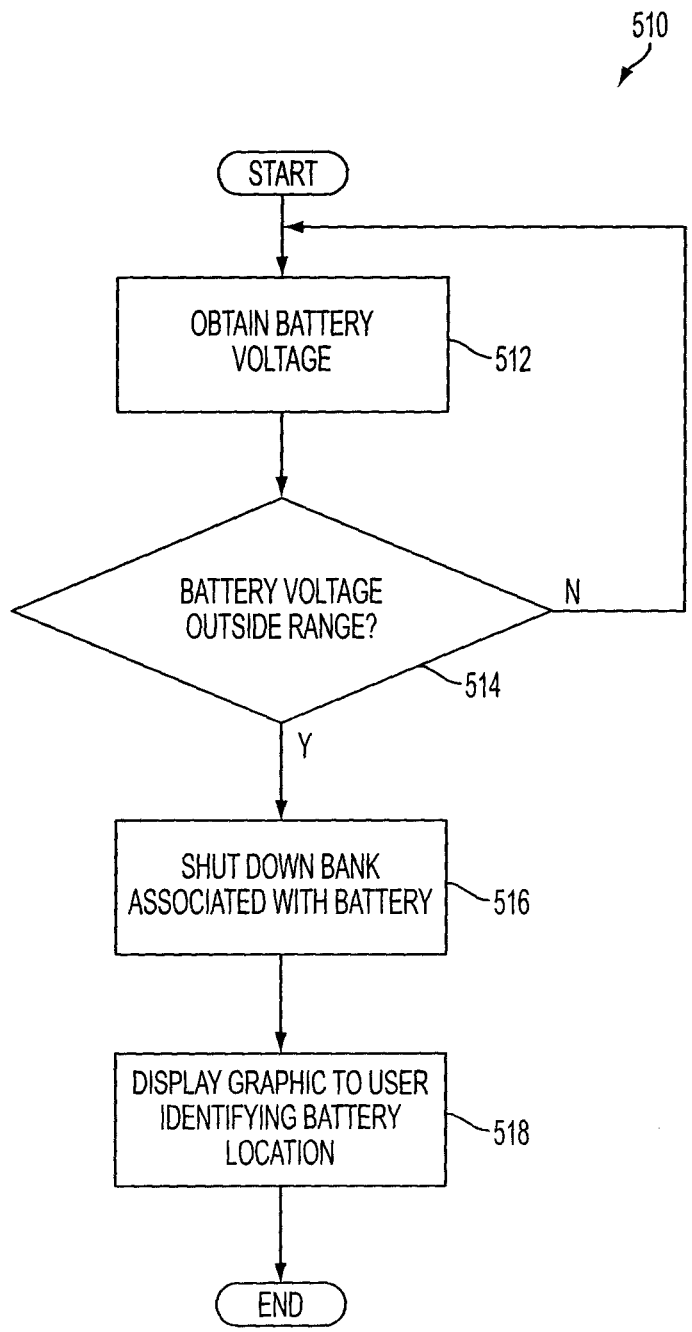
FIG. 12 is a flowchart showing a method of monitoring the voltage of each battery module of the CES system of FIG. 1.

The master BMS 500 processes the received measurements to ensure safe and efficient operation of the CES system 100. For example, the master BMS 500 processes the received voltage measurements according to method 510 shown in FIG. 12. The master BMS 500 receives the voltage of each battery module 230 for each battery bank 200a to 200d (step 512). A check is performed to determine if any one of the voltages is outside a defined voltage range (step 514). If none of the voltages are outside of the predefined voltage range, the CES system 100 is deemed to be operating normally. If any one of the voltages is outside the defined voltage range, a fault is detected and thus the bank 200a to 200d comprising the battery module that caused the fault is shut down via the switching gear 550 (step 516). A graphic is displayed on the display screen to identify the location of the battery module that caused the fault (518). In the event that more than one of the banks 200a to 200d are shut down, the CES system 100 is deemed to be inoperable and is shut down.

Figure 13:
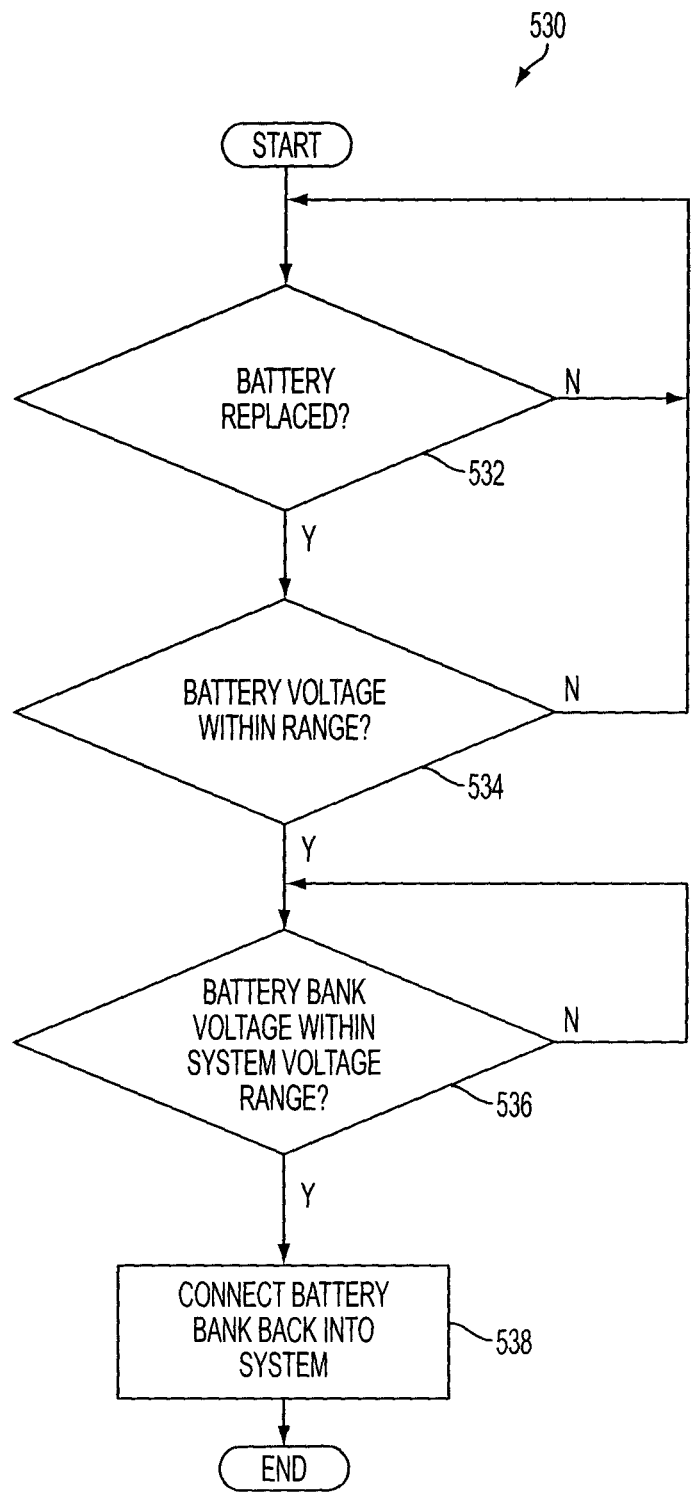
FIG. 13 is a flowchart showing a method of repairing or replacing one of the battery modules of the CES system of FIG. 1.

When one of the battery banks 200a to 200d has been shut down, the CES system 100 continues to operate using only three battery banks 200a to 200d until the battery module that caused the fault is replaced or repaired. To determine if the battery module has been replaced or repaired, method 530 is employed as shown in FIG. 13.

A check is performed to determine if the battery module has been repaired or replaced (step 532). If the battery module has not been replaced, the CES system 100 continues to operate using only three banks 200a to 200d. In the event the battery module has been repaired or replaced, a check is performed to determine if the voltage of the battery bank is within the defined range (step 534). If the voltage is outside the defined range, the method returns to step 532 until the battery module has been repaired or replaced. If the voltage is within the defined range, the master BMS 500 checks the charging/discharging state of the active battery banks 200a to 200d (step 536). The master BMS 500 waits until the voltage level of the active battery banks is approximately at the same level as the inactive battery bank, and then activates the inactive battery bank such that all four battery banks 200a to 200d are active (step 538).

Figure 14:
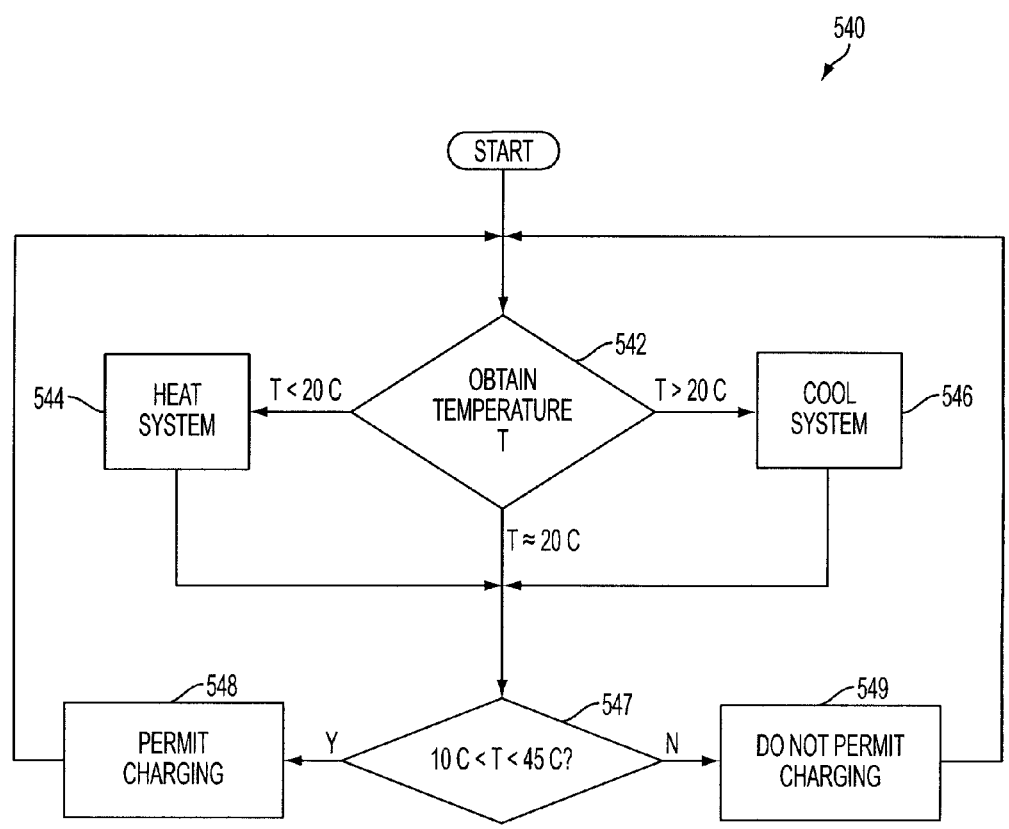
FIG. 14 is a flowchart showing a method of monitoring the temperature of each battery module of the CES system of FIG. 1.

As another example, the master BMS 500 processes the received temperature measurements according to method 540, shown in FIG. 14. The master BMS 500 receives the temperature of each battery module 530 for each battery bank 200a to 200d. Each temperature is compared to a temperature threshold, which in this embodiment is 20° C. (step 542). In the event the temperature is less than the temperature threshold, the heating system 700 is activated (step 544) and the method continues to step 548. In the event the temperature is greater than the temperature threshold, the cooling system 800 is activated (step 546) and the method continues to step 547. In the event the temperature is approximately equal to the temperature threshold the method continues to step 547. Each temperature is compared to a temperature range, which in this embodiment is between 10° C. and 45° C. (step 547). If the temperature is within the temperature range for all battery modules within one of the battery banks 200a to 200d, that particular battery bank 200a to 200d is permitted to charge (step 548). If the temperature is outside the temperature range for one or more of the battery modules within one of the battery banks 200a to 200d, that particular battery bank 200a to 200d is not permitted to charge (step 549) and thus the bank is inactive until the one or more battery modules are replaced according to a method similar to method 530 above.

The switching gear 550 is used to activate/deactivate one or more of the battery banks 200a to 200d from the CES system 100. As mentioned previously, the CES system 100 is operable in the event three or more battery banks 200a to 200d are active.

The CPPM module 600 in this embodiment is similar to that described in U.S. Provisional Patent Application No. 61/587,649 to Himanshu et al., filed on Jan. 17, 2012, the entire disclosure of which is incorporated herein by reference. Generally, the CPPM module 600 is electrically coupled to the power grid through a convertor. The CPPM module 600 receives signals from the power grid and sends signals to the master BMS 500 to perform functions based on the status of the power grid. For example, if the power grid is overloaded, the CPPM module 600 will send a signal to the master BMS 500 which will then activate the battery banks 200a to 200d thereby discharging energy from the power grid to help shave peak demand.

Other applications of the CES system 100 include: energy efficiency such as for example power factor correction and reduced losses; time of use such as for example peak shaving and valley filling based on time of use periods; demand management such as for example shaving off peak demands; frequency regulation such as for example Volt/VAR optimization, grid stability and power quality; renewable integration such as for example to facilitate the connection of clean energy into building operations, including voltage regulation, buffering of intermittency, and ensuring green electricity is locally consumed; electric vehicle charging by supporting fast charging of electric vehicles without requiring facility or utility capacity upgrades; facility expansion by supporting load growth in local facility without requiring capacity upgrade from the utility company; demand response; backup power; and for supporting microgrids.

Although embodiments have been described above with reference to the accompanying drawings, those of skill in the art will appreciate that variations and modifications may be made without departing from the scope thereof as defined by the appended claims.

What is claimed is:

1. A community energy storage system comprising:
   a cabinet having at least two compartments, each compartment having a door providing selective access thereto;
   at least one non-conductive terminal rail mounted within each compartment of the cabinet opposite the door,
   a plurality of terminal connectors mechanically connected to each non-conductive terminal rail, each terminal connector having a first end adjacent a first side of the non-conductive terminal rail and a second end adjacent a second side of the non-conductive terminal rail, the first and second ends electrically coupled to one another;
   at least two battery banks, each battery bank positioned within a respective one of the compartments and comprising a plurality of battery modules, each one of the plurality of battery modules comprising a positive terminal and a negative terminal extending from an end thereof, each positive and negative terminal configured to mechanically engage and electrically couple to the first end of a respective one of the plurality of terminal connectors such that the battery module is readily removable from the compartment via the door; and
   a plurality of connectors configured to electrically couple the second ends of the plurality of terminal connectors to one another such that the plurality of battery modules in each battery bank are electrically coupled in series,
   wherein the at least two battery banks are simultaneously active during normal operation.

2. The community energy storage system of claim 1 wherein each positive and negative terminal is mechanically engaged with the respective one of the plurality of terminal connectors via friction fit.

3. The community energy storage system of claim 2 wherein each battery module is readily removeable by disengaging the positive and negative terminals from the respective one of the terminal connectors.

4. The community energy storage system of claim 1 further comprising switching gear configured to selectively activate and deactivate each battery bank.

5. The community energy storage system of claim 4 further comprising processing structure positioned within a third compartment of the cabinet and configured to:
   monitor at least one parameter of each of the battery modules; and
   send a signal to the switching gear to deactivate one of the battery banks when a battery module of the one of the battery banks has at least one parameter outside of a threshold value.

6. The community energy storage system of claim 5 where the at least one parameter is at least one of temperature, voltage, current, state of charge, cell capacity and efficiency.

7. The community energy storage system of claim 5 further comprising a display screen positioned within the third compartment of the cabinet, the processing structure and the display screen configured to display to indicate to a user which battery module has a parameter value outside of the threshold value.

8. The community energy storage system of claim 5 further comprising a heating and cooling system configured to selectively provide heating and cooling to the battery banks.

9. The community energy storage system of claim 8 wherein the at least one parameter is temperature and the processing structure is configured to activate the heating and cooling system to heat or cool the battery banks based on the temperature.

* * * * *